(12) United States Patent
Lee et al.

(10) Patent No.: US 6,303,970 B1
(45) Date of Patent: Oct. 16, 2001

(54) SEMICONDUCTOR DEVICE WITH A PLURALITY OF FUSES

(75) Inventors: Chang-Ho Lee, Suwon; Jun-Young Jeon, Seoul, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/345,691

(22) Filed: Jun. 30, 1999

(30) Foreign Application Priority Data

Jul. 3, 1998 (KR) ................................................. 98-26915

(51) Int. Cl.[7] .......................... H01L 29/00; H01L 23/58; H01L 23/62; H01L 31/0328
(52) U.S. Cl. .......................... 257/529; 257/530; 257/665; 257/173; 257/355
(58) Field of Search .................................. 257/529, 530, 257/665, 173, 355

(56) References Cited

U.S. PATENT DOCUMENTS 5,723,898 * 3/1998 Gilmour et al. ...................... 257/529
5,808,363 * 9/1998 Watanabe ............................. 257/758
6,078,091 * 6/2000 MacPherson et al. ............... 257/529

FOREIGN PATENT DOCUMENTS

2260219A * 4/1993 (GB) .................................... 257/529

* cited by examiner

Primary Examiner—Eddie Lee
Assistant Examiner—Jesse A Fenty
(74) Attorney, Agent, or Firm—Marger Johnson & McCollom, P.C.

(57) ABSTRACT

In the present invention, a semiconductor device includes a first insulation layer formed on a semiconductor substrate, an elevating pad formed on the first insulation layer, a second insulation layer covering the elevating pad, a plurality of fuses formed on the second insulation layer and over the elevating pad, a third insulation layer formed on the fuses, and an opening formed in a top portion of the third insulation layer and over the fuses. With this invention, the horizontal level of the fuses are elevated due to the existence of the elevating pad, which makes the distance between the fuse window and fuses be closer than that of the conventional and that reduces the step difference. Thus, a laser beam can reliably blow out all of the fuses reliably.

7 Claims, 4 Drawing Sheets

US 6,303,970 B1

SEMICONDUCTOR DEVICE WITH A PLURALITY OF FUSES

FIELD OF THE INVENTION

The present invention relates to a semiconductor device, and more particularly, to a semiconductor memory device having a plurality of fuses for replacing defective memory cells or determining operation modes.

BACKGROUND OF THE INVENTION

As circuit density has increased, increasing production yield has become more difficult in the manufacture of integrated circuit memory devices. There are basically two techniques to improve the production yield of the memory devices. The first technique is to enhance the quality of the manufacturing process so as to reduce the occurrence of defective memory cells. The second technique is to modify the construction of a memory cell array, such that a portion of the memory cell array is set aside as a redundant memory section. The redundant memory cells are accessed whenever it is determined that an incoming address corresponds to a defective portion of the memory cell array. On-chip logic circuitry employed to store defective memory addresses includes multiple fuse groups wherein individual fuses are either opened or closed to represent a logic state. The memory devices can also be designed with a number of different operation modes. One method to select an operation modes is to use fuses (i.e., option fuses). The fuses employed in the redundancy and mode option are normally either filament type, or a laser-blown type fuses. Such fuses are made of polysilicon or molybdenum silicide and are formed on a field oxide layer at the level of a wiring layer.

Referring to FIGS. 1 through 3, a conventional arrangement of fuses of a semiconductor memory device is shown. A plurality of fuses 10a–10d are formed spaced apart an equal distance from each other, and a fuse window 20 is provided over the construction in order to define an opening region 11 (or 11') of FIGS. 2 and 3. Metal lines M are arranged for peripheral circuit areas adjacent to the fuse region. The fuse window restricts the formation of other circuit components and permits a laser beam to be introduced there into through insulation layer 14 (of FIGS. 2 and 3) so as to blow out the fuses. After the fuses are formed, oxide and nitride insulation layers 14, 16 are deposited on the resulting structure. And a region of insulation layer 16 and a portion of insulation layer 14 are removed to a predetermined thickness, thereby forming an opening therein. Successful fuse cutting by a laser beam in a subsequent process step depends on the accuracy of such a process. As shown in FIG. 2, however, edge portions 11a and 11b of opening region 11 are not sharp. Because of this, fuses 10a through 10d are not positioned identically with respect to the surface of the insulation layer 14. In this example, the distance between the surface of the insulation layer 14 and fuses 10b and 10c is shorter than the distance between the surface of the insulation layer 14 and fuses 10a and 10d, due to the existence of the thick inner edge portions 11a and 11b. As a result, the fuses near the inner edge portions 11a and 11b are difficult to be blown out even by an accurately aimed laser beam.

Widening an opening region can be one way to overcome such a problem. But it is not an ultimate solution because widening also increases a layout area. Also, in order to enhance the compensation rate for hard defects in a chip, it is desirable to include a greater redundancy capability by minimizing the width of each fuse region, thus allowing more fuses in a given redundancy area. Since the fuse size is fixed, elongation of the opening undesirably increases the layout size.

SUMMARY OF THE INVENTION

Accordingly, it is an object of the present invention to provide a semiconductor device having a reliable fuse structure that can overcome the above mentioned problems.

It is another object of the invention to provide a semiconductor device having a fuse structure adaptable to a stable performance in a fuse-cutting operation.

In order to accomplish those objects, a semiconductor device of the present invention includes a semiconductor substrate, a first insulation layer formed on the semiconductor substrate, an elevating pad formed on the first insulation layer, a plurality of fuses formed over the elevating pad, a second insulation layer surrounding the fuses, and an opening formed on the second insulation layer and over the fuses.

Another aspect of the invention is a semiconductor device including a semiconductor substrate, a first insulation layer formed on the semiconductor substrate, an elevating pad formed on the first insulation layer and defined in a predetermined area, a second insulation layer covering the elevating pad, a plurality of fuses formed on the second insulation layer and over the elevating pad, a third insulation layer formed on the fuses, and an opening formed on the third insulation layer and over the fuses.

Another aspect of the invention is a semiconductor memory device having a plurality of metal-oxide-semiconductor transistors and bit lines formed of polysilicon, including a semiconductor substrate, a first insulation layer formed on the semiconductor substrate, a patterned conductive layer formed on the first insulation layer and defined in a predetermined area, the patterned conductive layer being formed when gate electrodes of the transistors are formed, a second insulation layer covering the patterned conductive layer, a plurality of fuses formed on the second insulation layer and over the patterned conductive layer, the fuses are formed when the bit lines are formed, a third insulation layer formed on the fuses, and an opening formed on the third insulation layer and over the fuses.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the FIGS., like reference numerals denote like or corresponding parts.

DETAILED DESCRIPTION OF PREFERRED EMBODIMENTS

Hereinbelow, applicable embodiments of the invention will be as follows, with the appended drawings.

Figure 1:
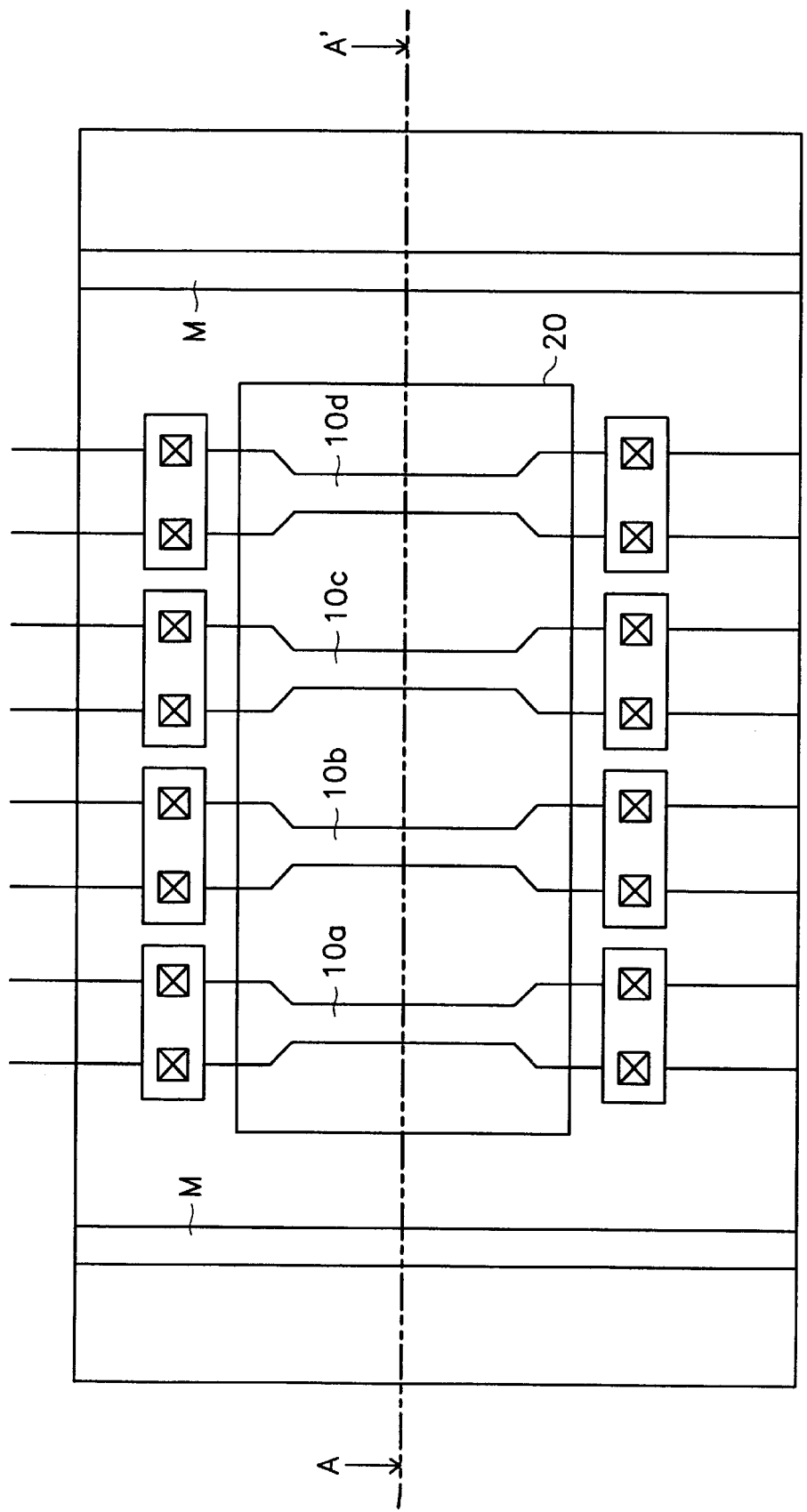
FIG. 1 shows a conventional arrangement of fuses in a semiconductor memory device.
Figure 2:
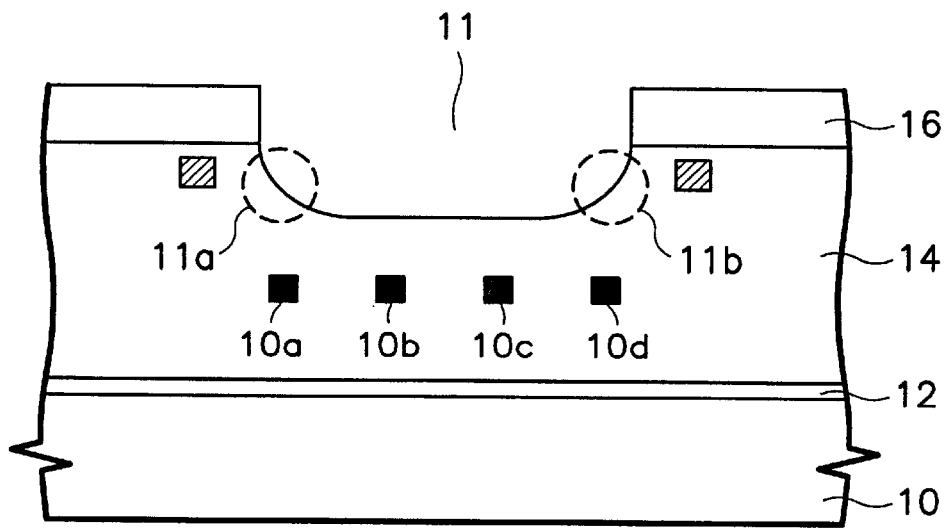
FIGS. 2 and 3 are cross-sectional views taken along line A–A' of FIG. 1.
Figure 3:
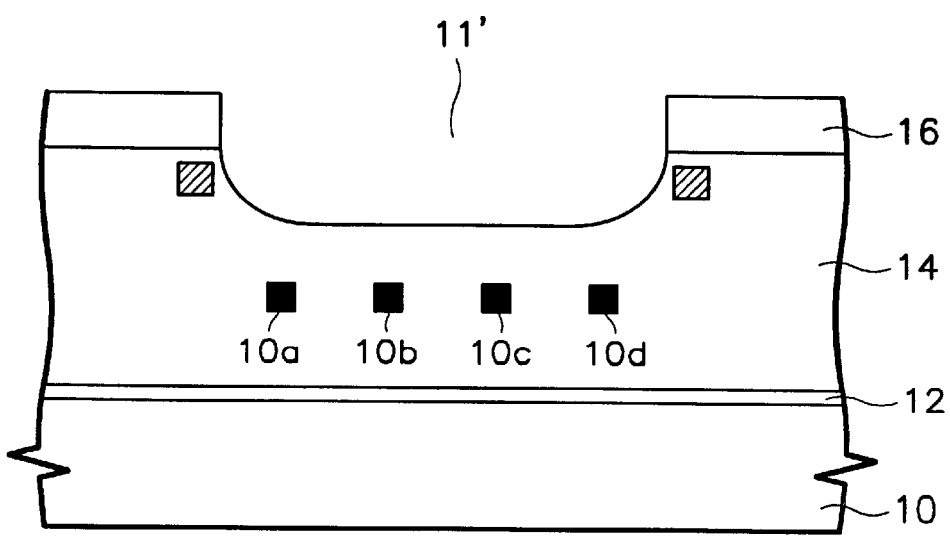
Figure 4:
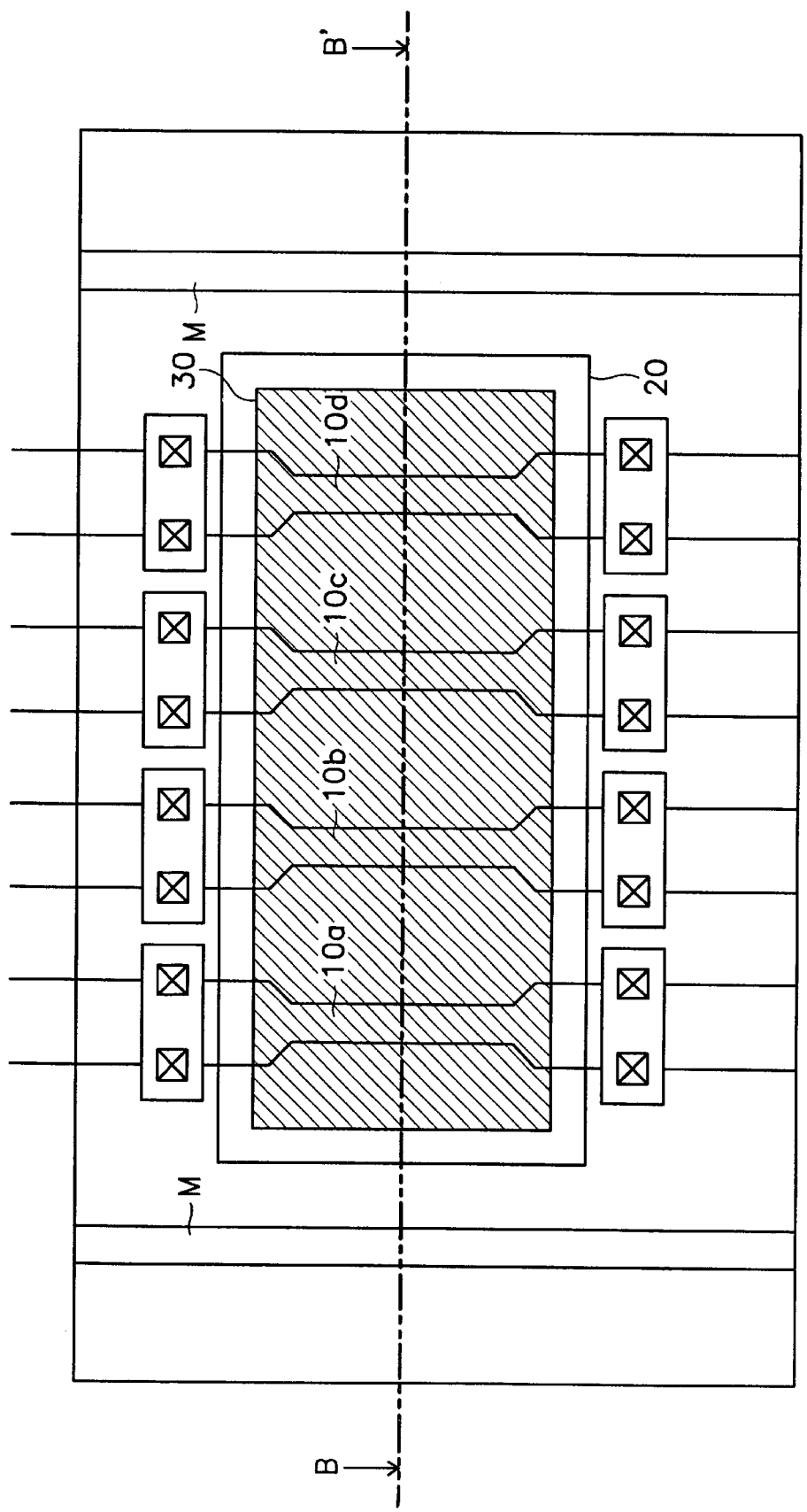
FIG. 4 is a top view showing an arrangement of fuses and patterns in a semiconductor memory device of the present invention.
Figure 5:
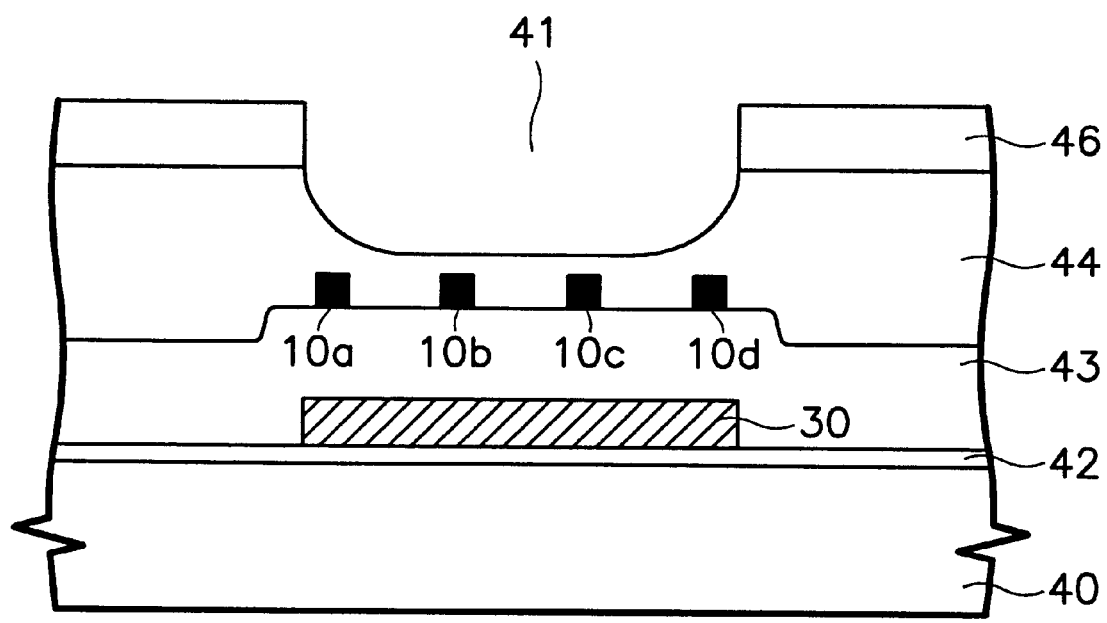
FIG. 5 is a cross-sectional view taken along line B–B' of FIG. 4.

Referring to FIG. 4, fuses 10a through 10d, formed of polysilicon, are spaced apart an equal distance from each other. The fuses can be formed when bit lines are constructed. A fuse window 20 defines an exposed area over the fuses. Metal lines M are disposed at the sides of fuse window 20. The hatched portion 30 denotes a patterned polysilicon conductive layer formed under the fuses. FIG. 5 is a cross-sectional view of FIG. 4 taken along line B–B'. As shown in FIG. 5, a field oxide layer 42 is formed on a semiconductor substrate 40. Next, a first polysilicon layer is deposited on field oxide layer 42. The first polysilicon layer is patterned as illustrated in FIG. 4. The patterned first polysilicon layer 30 is placed only under the fuses. The patterned first polysilicon layer can be formed while gate polysilicon layers for MOS transistors are formed in a chip. Then, an insulation layer 43 is deposited on the patterned first polysilicon layer 30. Subsequently, a second polysilicon layer is deposited and shaped into fuses 10a to 10d. The forming of the fuses with polysilicon may be accomplished by performing it simultaneously with a polysilicon bit line construction step. After the fuses are formed, oxide and nitride insulation layers 44, 46 are sequentially deposited on fuses 10a to 10d. After depositing nitride layer 46, an etching process is carried out to form an opening 41 that exposes isolation layer 44 covering the fuses. The thickness of the insulation layer 44 formed on the fuses, after etching, is about 2000 Å to 3000 Å. Passivation and polymide layers may be formed on the nitride layer, although not shown in FIG. 5.

As a result, the horizontal level of the fuses are elevated due to the existence of the patterned first polysilicon layer 30, which makes the distance between the fuse window and fuses be closer than that of the conventional and reduces the step difference. Thus, a laser beam can reliably blow out all of the fuses.

Although specific constructions and procedures of the invention have been illustrated and described herein, it is not intended that the invention be limited to the elements and constructions disclosed. One skilled in the art will easily recognize that the particular elements or subconstruction may be used without departing from the scope and spirit of the invention.

What is claimed is:

1. A semiconductor device comprising:

a semiconductor substrate;

an elevating pad formed on the semiconductor substrate;

a plurality of fuses formed over the elevating pad;

an insulation layer surrounding the fuses; and an opening formed in a top portion of the insulation layer and over the fuses.

2. The semiconductor device according to claim 1, wherein the fuses are electrically separated from each other.

3. The semiconductor device according to claim 1, wherein the elevating pad is placed only under the fuses.

4. A semiconductor device comprising:

a semiconductor substrate;

a first insulation layer formed on the semiconductor substrate;

an elevating pad formed on the first insulation layer;

a second insulation layer covering the elevating pad;

a plurality of laser-fusible fuses formed on the second insulation layer overlying the elevating pad;

a third insulation layer formed on the fuses; and an opening formed in a top portion of the third insulation layer so as to overlie the fuses.

5. The semiconductor device according to claim 4, wherein said elevating pad is formed of an electrically conductive material.

6. The semiconductor device according to claim 4, wherein said third insulating layer is formed to a thickness of about 2000 Å to 3000 Å.

7. A semiconductor memory device having a plurality of metal-oxide-semiconductor transistors and bit lines formed of polysilicon, the device comprising:

a semiconductor substrate;

a first insulation layer formed on the semiconductor substrate;

a patterned conductive layer formed on the first insulation layer, the patterned conductive layer being formed when gate electrodes of the transistors are formed;

a second insulation layer covering the patterned conductive layer;

a plurality of fuses formed on the second insulation layer overlying the patterned conductive layer, the fuses being formed when the bit lines are formed;

a third insulation layer formed on the fuses; and an opening formed in a top portion of the third insulation layer so as to overlie the fuses.

* * * * *